United States Patent
Hashimoto et al.

(10) Patent No.: US 10,115,756 B2
(45) Date of Patent: Oct. 30, 2018

(54) SOLID-STATE IMAGE PICKUP DEVICE AND IMAGE PICKUP SYSTEM HAVING LIGHT SHIELDING PORTION WITH FIRST AND SECOND FILMS ON RESPECTIVE UNDER FACE AND UPPER FACE SIDES

(71) Applicant: CANON KABUSHIKI KAISHA, Tokyo (JP)

(72) Inventors: Kouhei Hashimoto, Kawasaki (JP); Takahiro Hachisu, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/362,636

(22) Filed: Nov. 28, 2016

(65) Prior Publication Data

US 2017/0077160 A1    Mar. 16, 2017

Related U.S. Application Data

(63) Continuation of application No. 13/771,942, filed on Feb. 20, 2013, now Pat. No. 9,536,923.

(30) Foreign Application Priority Data

Feb. 24, 2012  (JP) .................................. 2012-038879

(51) Int. Cl.
  *H01L 27/146* (2006.01)
  *H01L 27/148* (2006.01)
  (Continued)

(52) U.S. Cl.
  CPC .... *H01L 27/14623* (2013.01); *H01L 27/1462* (2013.01); *H01L 27/14627* (2013.01); *H01L 27/14643* (2013.01); *H01L 27/14806* (2013.01); *H04N 5/3696* (2013.01); *H04N 5/374* (2013.01); *H04N 5/378* (2013.01); *H04N 5/23212* (2013.01)

(58) Field of Classification Search
  CPC ............. H01L 27/146; H01L 27/14625; H01L 27/14806; H04N 5/23212; H04N 5/3696
  See application file for complete search history.

(56) References Cited

U.S. PATENT DOCUMENTS

2005/0247991 A1* 11/2005 Maruyama ........ H01L 27/14843
                                                    257/432
2011/0216315 A1*  9/2011 Uematsu ................... G01J 3/02
                                                    356/326

(Continued)

FOREIGN PATENT DOCUMENTS

JP    2002-289609 A   10/2002
JP    2004-104203 A    4/2004
(Continued)

*Primary Examiner* — Twyler Haskins
*Assistant Examiner* — Akshay Trehan
(74) *Attorney, Agent, or Firm* — Canon U.S.A., Inc. IP Division

(57) ABSTRACT

A solid-state image pickup device has an image pickup pixel including a first photoelectric conversion portion and a first transistor and a focus detection pixel including a second photoelectric conversion portion, a second transistor, and a light shielding portion, in which a reflection preventing portion is provided on the underface side of the light shielding portion.

18 Claims, 4 Drawing Sheets

(51) Int. Cl.
*H04N 5/369* (2011.01)
*H04N 5/374* (2011.01)
*H04N 5/378* (2011.01)
*H04N 5/232* (2006.01)

(56) References Cited

U.S. PATENT DOCUMENTS

| | | | | |
|---|---|---|---|---|
| 2011/0233388 A1* | 9/2011 | Nakamura | ................ | G01J 3/02 |
| | | | | 250/226 |
| 2011/0273599 A1* | 11/2011 | Murata | .................... | G02B 7/36 |
| | | | | 348/294 |
| 2011/0279727 A1* | 11/2011 | Kusaka | ............ | H01L 27/14621 |
| | | | | 348/340 |
| 2012/0080804 A1* | 4/2012 | Trivedi | ............... | H01L 21/7682 |
| | | | | 257/774 |

FOREIGN PATENT DOCUMENTS

| | | | |
|---|---|---|---|
| JP | 2005-005540 | A | 1/2005 |
| JP | 2008-218755 | A | 9/2008 |
| JP | 2008-227250 | A | 9/2008 |
| JP | 2009-105358 | A | 5/2009 |
| JP | 2009-157198 | A | 7/2009 |
| JP | 2009170540 | A | 7/2009 |
| JP | 2009-244862 | A | 10/2009 |
| JP | 2010-062437 | A | 3/2010 |
| JP | 2010-239155 | A | 10/2010 |
| JP | 2011-124501 | A | 6/2011 |
| JP | 2011176715 | A | 9/2011 |
| JP | 2011-199318 | A | 10/2011 |
| JP | 2011216623 | A | 10/2011 |
| WO | 2004/097930 | A1 | 11/2004 |
| WO | 2009157413 | A1 | 12/2009 |

* cited by examiner

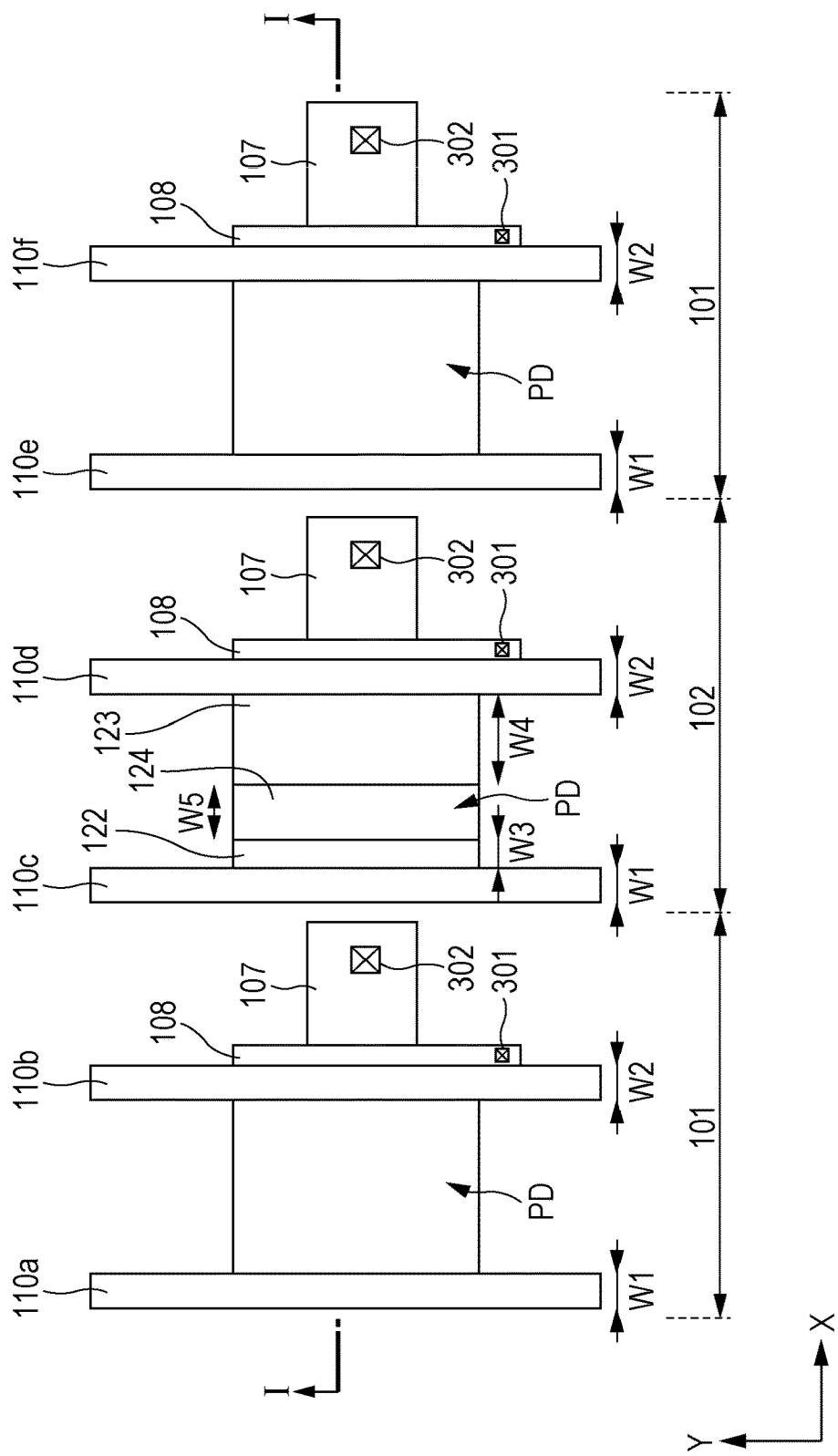

SOLID-STATE IMAGE PICKUP DEVICE AND IMAGE PICKUP SYSTEM HAVING LIGHT SHIELDING PORTION WITH FIRST AND SECOND FILMS ON RESPECTIVE UNDER FACE AND UPPER FACE SIDES

CROSS-REFERENCE TO RELATED APPLICATION

This application is a Continuation of U.S. application Ser. No. 13/771,942, filed Feb. 20, 2013, which claims priority from Japanese Patent Application No. 2012-038879 filed Feb. 24, 2012, which are hereby incorporated by reference herein in their entireties.

BACKGROUND OF THE INVENTION

Field of the Invention

One disclosed aspect of the embodiments relates to a solid-state image pickup device having a light shielding portion and an image pickup system employing the same.

Description of the Related Art

In recent years, a solid-state image pickup device capable of performing image pickup and focus detection has been desired. As the solid-state image pickup device capable of performing image pickup and focus detection, a solid-state image pickup device employing a pupil division phase difference method as a focus detection method has been proposed. The solid-state image pickup device employing the pupil division phase difference method has a focus detection pixel provided with a light shielding portion which specifies a region where incident light enters a photoelectric conversion portion.

Japanese Patent Laid-Open No. 2009-105358 discloses a Complementary Metal Oxide Semiconductor (CMOS) type solid-state image pickup device in which a light shielding portion of a focus detection pixel is formed by a metal member of the lowermost member among a plurality of layers of metal members.

SUMMARY OF THE INVENTION

One disclosed aspect of the embodiments provides a solid-state image pickup device in which reflection in a light shielding portion extending above a photoelectric conversion portion is reduced and an image pickup system employing the same. A solid-state image pickup device according to one aspect of the embodiments has an image pickup pixel having a first photoelectric conversion portion and a first transistor for reading out a signal based on a charge generated in the photoelectric conversion portion and a focus detection pixel having a second photoelectric conversion portion, a second transistor for reading out a signal based on a charge generated in the photoelectric conversion portion, and a light shielding portion, in which a reflection preventing portion is provided on the underface side of the light shielding portion.

Further features of the disclosure will become apparent from the following description of exemplary embodiments with reference to the attached drawings.

BRIEF DESCRIPTION OF THE DRAWINGS

FIG. 3 is a schematic plan view for explaining the solid-state image pickup device of the first embodiment.

DESCRIPTION OF THE EMBODIMENTS

A solid-state image pickup device according to one aspect of the embodiments has an image pickup pixel and a focus detection pixel. The image pickup pixel includes a first photoelectric conversion portion and a first transistor for reading out signals based on charges generated in the photoelectric conversion portion. The focus detection pixel includes a second photoelectric conversion portion, a second transistor for reading out signals based on charges generated in the second photoelectric conversion portion, and a light shielding portion. In the solid-state image pickup device, a reflection preventing portion is provided on the underface side of the light shielding portion.

Such a configuration may reduce a possibility in which light reflecting on a light receiving face of the photoelectric conversion portion reflects on the underface of the light shielding portion provided in the focus detection pixel to enter an unintended region.

A solid-state image pickup device according to another aspect has a first pixel including a first photoelectric conversion portion and a first transistor and a second pixel including a second photoelectric conversion portion and a second transistor. The second pixel further has a light shielding portion for narrowing an opening of the second photoelectric conversion portion than an opening of the first photoelectric conversion portion. In the solid-state image pickup device, a reflection preventing portion is provided on the underface side of the light shielding portion. Such a configuration may reduce the reflection of light reflecting on a light receiving face of the photoelectric conversion portion on the underface of the light shielding portion in the second pixel having the light shielding portion extending above the photoelectric conversion portion rather than in the first pixel.

Hereinafter, embodiments are described in detail with reference to the drawings. In the description, a face on the side on which elements (e.g., Metal Oxide Semiconductor (MOS) transistor) are provided of a semiconductor substrate is defined as a principal face and a direction to the inside of the semiconductor substrate from the principal face is defined as a downward direction. A direction opposite to the downward direction, i.e., a direction to a wiring line for each element from the principal face, is defined as an upward direction. A solid-state image pickup device of each embodiment is a CMOS type solid-state image pickup device but may be a solid-state image pickup device of another type may be acceptable.

First Embodiment

Figure 1:
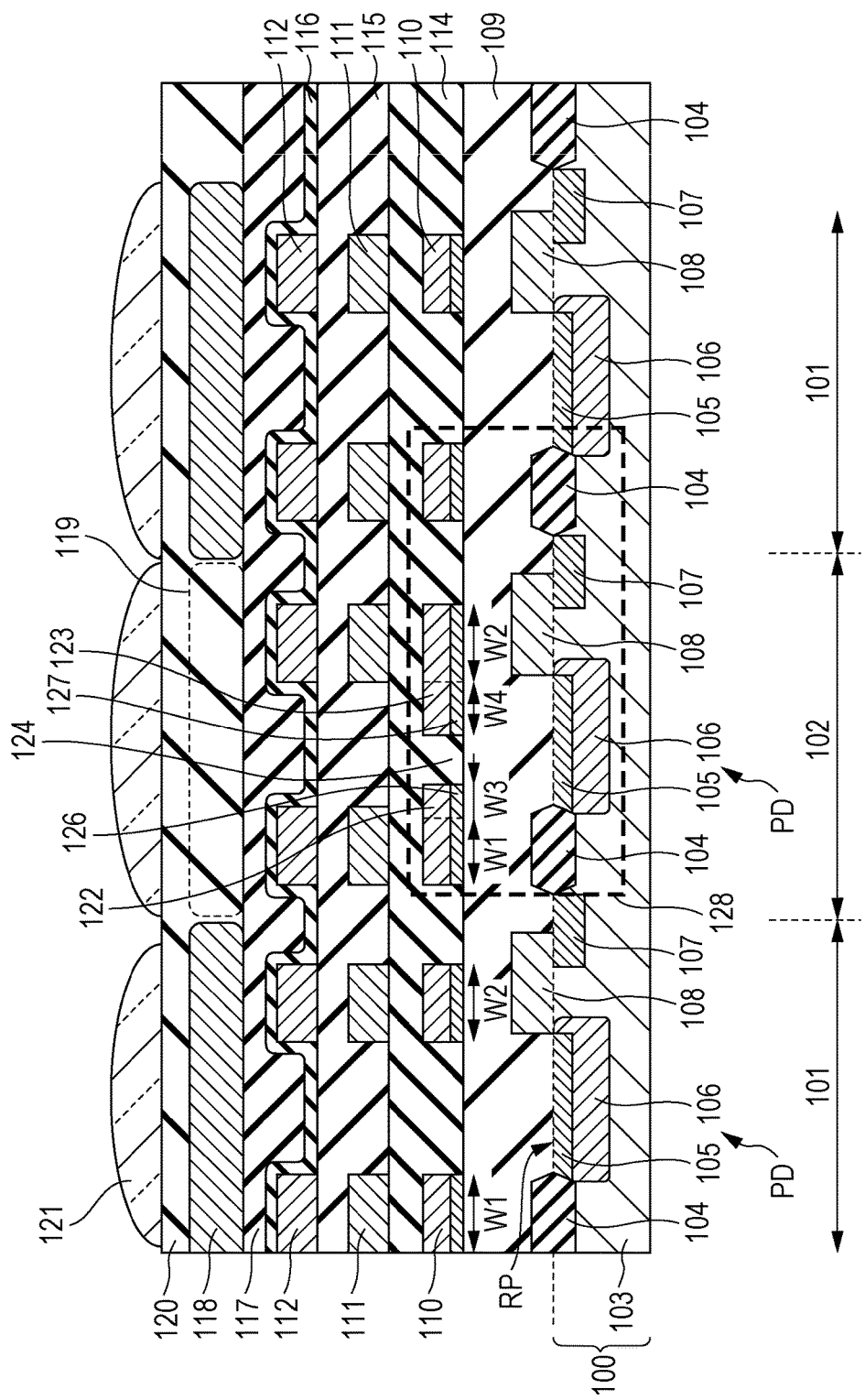
FIG. 1 is a schematic cross sectional view for explaining a solid-state image pickup device of a first embodiment.

A solid-state image pickup device of this embodiment is described with reference to FIGS. 1 to 4. FIG. 1 illustrates a schematic cross sectional view of the solid-state image pickup device of this embodiment. FIG. 3 illustrates a schematic plan view of the solid-state image pickup device of this embodiment. FIGS. 1 to 3 illustrate two first pixels 101 and one second pixel 102 disposed in an image pickup region of the solid-state image pickup device. In this embodiment, the first pixels 101 are image pickup pixels and the second pixel 102 is a focus detection pixel. The first pixels 101 and the second pixel 102 have equivalent structures except a light shielding portion. Hereinafter, the equivalent structures are designated by the same reference numerals and the description thereof is omitted. The image pickup region is a region where a plurality of pixels is disposed. The light shielding portion is a light shielding member for focus detection. In addition thereto, a member for shielding light in regions other than the photoelectric conversion portion, wiring lines, and the like are present. In the following description, the light shielding portion refers to a portion which is further provided for focus detection to a light shielding member provided in a general solid-state image pickup device for image pickup. In the general image pickup device, the light shielding portion serves also as a wiring line in many cases.

In FIG. 1, the second pixel 102 is disposed between the two first pixels 101. Each pixel has a photoelectric conversion portion PD including a P-type semiconductor region 103 provided in the semiconductor substrate 100, an N-type semiconductor region 105 provided in the semiconductor region 103, and a P-type semiconductor region 106 covering the top of the semiconductor region 105. In this embodiment, although the photoelectric conversion portion PD is a photodiode, another aspect may be acceptable. In this embodiment, a light receiving face RP of the photoelectric conversion portion is included in the principal face of the semiconductor substrate 100. The solid-state image pickup device may be a rear face irradiation type in which the light receiving face RP is included in the rear face of the semiconductor substrate 100.

Each pixel has the photoelectric conversion portion PD and an N-type semiconductor region 107 to which charges thereof are transmitted. The semiconductor region 107 is also referred to as a floating diffusion region (FD region). Each pixel has a gate electrode 108 which is provided on a gate insulating film (not illustrated) between the photoelectric conversion portion PD and the semiconductor region 107 and controls the electrical connection between the photoelectric conversion portion PD and the semiconductor region 107. The elements are isolated by element isolations 104 including an insulator provided on the principal face side of the semiconductor substrate 100. An insulating film 109 is provided on the photoelectric conversion portion PD, the gate electrode 108, and the semiconductor region 107. The insulating film 109 contains silicon oxide materials, for example.

On the insulating film 109, first wiring members 110, an insulating film 114, second wiring members 111, an insulating film 115, and third wiring members 112 are formed in this order from the insulating film 109 side. Between the element and the wiring member, a contact plug (not illustrated) is provided. Between the wiring member and the wiring member, a via plug (not illustrated) is provided. On the third wiring members 112, a protective film 116 is provided. The protective film 116 may be a single member or a laminate member and, for example, has a structure in which a member containing silicon oxynitride, a member containing silicon nitride, and a member containing silicon oxynitride form a laminate member. On the protective film 116, an insulating film 117 containing an organic material for planarization is provided. On the insulating film 117, color filters 118 and a region 119 without the color filter are present. The color filter 118 is provided corresponding to each photoelectric conversion portion PD, and is green herein. An insulating film 120 is provided which covers the color filters 118, fills the region 119, and contains an organic material whose upper face is flat. On the insulating film 120, a micro lens 121 is provided corresponding to each photoelectric conversion portion PD. Herein, it may also be said that the region 119 is provided with a so-called colorlessness and transparent color filter. In this embodiment, the color filter 118 or the region 119 and the photoelectric conversion portion PD correspond one-to-one with each other but the disclosure is not limited thereto. The correspondence relationship between the micro lens 121 and the photoelectric conversion portion PD is also the same.

Herein, each wiring member contains aluminum, for example. Herein, the description "containing aluminum" means containing aluminum as the main component. The same applies to the following description. Each wiring member has a plurality of wiring lines (conductor patterns) in the same member, i.e., on the same height. The first wiring member 110 includes wiring lines 110a, 110b, 110c, 110d, 110e, and 110f. Although not illustrated in FIG. 1, the same applies to the second wiring member 111 and the third wiring member 112. The height is the distance from the principal face of the semiconductor substrate 100 to the wiring members.

In this embodiment, incident light into the photoelectric conversion portion PD is limited in the second pixel 102 rather than in the first pixels 101. Or, the area of an opening of the second pixel 102 is narrower than that of an opening of the first pixels 101. More specifically, a light shielding portion 122 and a light shielding portion 123 are provided which extend above the photoelectric conversion portion PD in the second pixel 102 rather than in the first pixels 101. An opening 124 is formed by the light shielding portion 122 and the light shielding portion 123. Pupil division of incident light is achieved by the opening 124, and then a signal required for focus detection is obtained.

In such a configuration, a reflection preventing portion 126 is provided on the underface of the light shielding portion 122 and a reflection preventing portion 127 is provided on the underface of the light shielding portion 123. Such a configuration may reduce the reflection of light, which reflects on the light receiving face RP of the photoelectric conversion portion PD, on the underface of the light shielding portion. Therefore, mixing of light into an unintended portion may be reduced, and thus an improvement of image quality and an improvement of focus detection performance are achieved. Herein, the reflection preventing portion 126 is one which may reduce reflection even if only slightly and one which has a function such that the member itself absorbs light or a function such that the member weakens light by interference at the upper and lower interfaces of the member or both the functions.

Figure 2A:
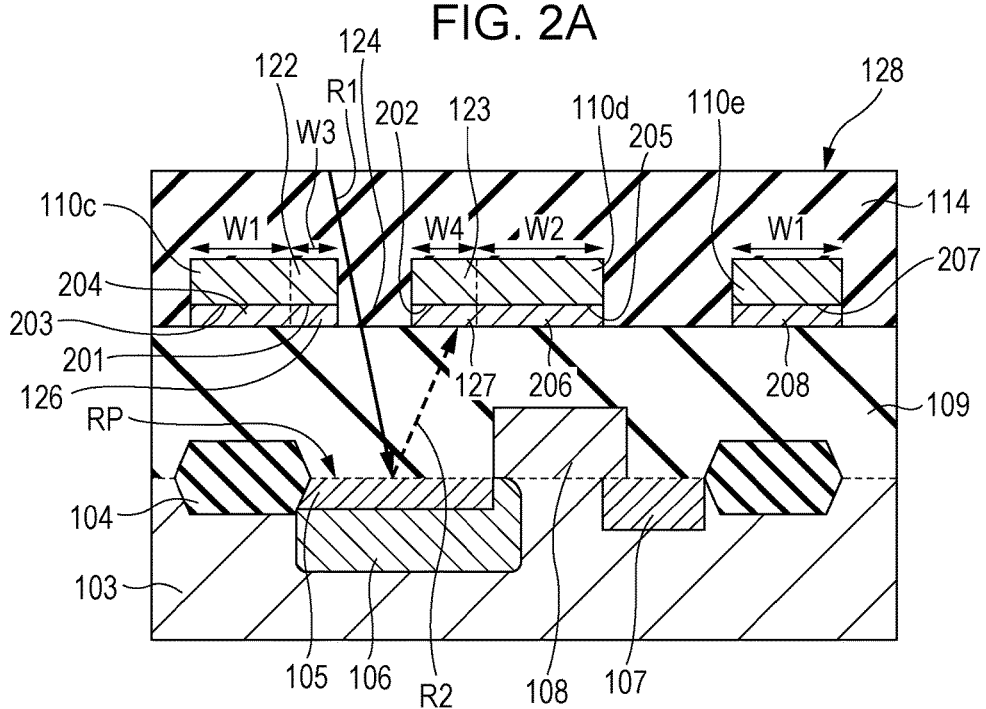
FIG. 2A is a schematic cross sectional view for explaining the solid-state image pickup device of the first embodiment.
Figure 2B:
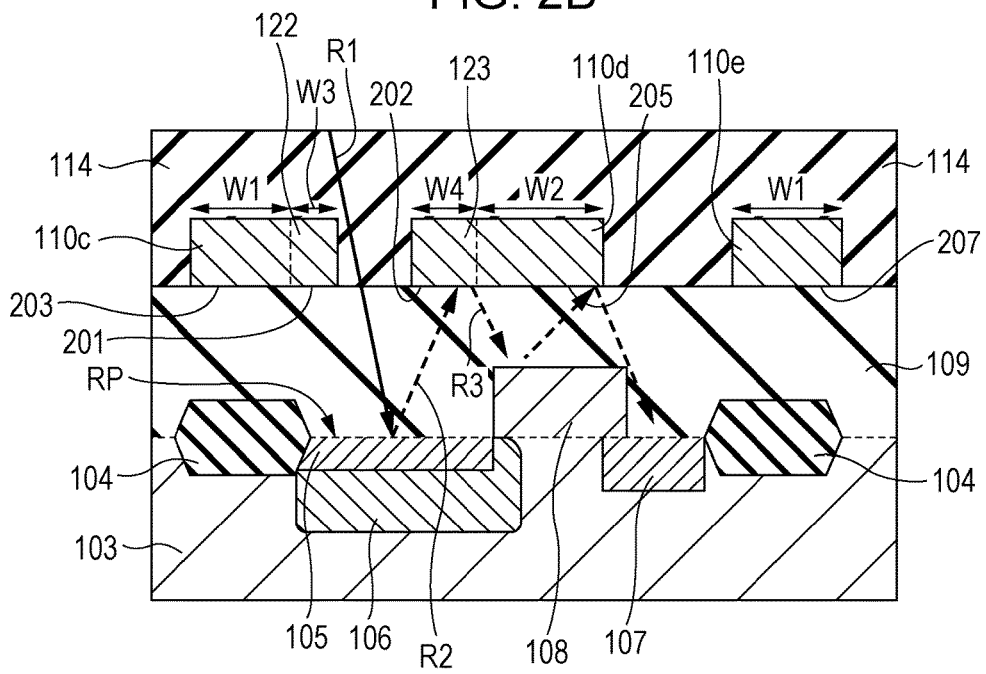
FIG. 2B is a schematic cross sectional view for explaining the solid-state image pickup device of the first embodiment.

The configuration of the reflection preventing portion is described in detail with reference to FIGS. 2A and 2B. FIG. 2A is a schematic cross sectional view of the solid-state image pickup device in which a region 128 of FIG. 1 is enlarged. FIG. 2B is a schematic cross sectional view of a solid-state image pickup device for comparison in the case where the reflection preventing portion is not provided in the configuration of FIG. 2A. In FIG. 2A, the reflection preventing portion 126 is provided between an underface 201 of the light shielding portion 122 and the insulating film 109. The reflection preventing portion 127 is provided between an underface 202 of the light shielding portion 123 and the insulating film 109. On the other hand, in FIG. 2B, the reflection preventing portion is not provided between the underface 201 of the light shielding portion 122 and the insulating film 109 and between the underface 202 of the light shielding portion 123 and the insulating film 109.

Herein, the case where light R1 enters the photoelectric conversion portion PD through the opening 124 is described. The light R1 reflects on the light receiving face RP of the photoelectric conversion portion PD. In FIG. 2A, the light R2 reflecting on the light receiving face RP enters the reflection preventing portion 127, and therefore the reflection of the light on the underface 202 of the light shielding portion 123 is difficult to occur. On the other hand, in FIG. 2B, light R2 reflecting on the light receiving face RP is likely to reflect on the underface 202 of the light shielding portion 123. Light R3 reflecting on the underface 202 may enter an unintended portion, such as the semiconductor region 107. When light enters regions other than the photoelectric conversion portion which light should enter, the image quality deteriorates. Herein, the unintended portion is the photoelectric conversion portion and the floating diffusion region which are adjacent thereto, for example. Herein, the amount of light reflecting on the underface 202 of the light shielding portion 123 is smaller in the structure of FIG. 2A than in the structure of FIG. 2B. Therefore, it becomes possible to reduce the influence of light which enters the unintended portions.

In FIG. 2A, a reflection preventing portion 204 is provided between an underface 203 of the wiring line 110c and the insulating film 109 and a reflection preventing portion 206 is provided between an underface 205 of the wiring line 110d and the insulating film 109. Such a configuration may further reduce light which enters the unintended portions. A reflection preventing portion 208 may be provided also between an underface 207 of the other wiring line 110e and the insulating film 109.

Next, the configuration of FIG. 1 is two-dimensionally described with reference to FIG. 3. FIG. 3 is a schematic plan view corresponding to FIG. 1. FIG. 3 illustrates a so-called plan layout in which arbitrary members are viewed from above the semiconductor substrate 100 to the principal face of the semiconductor substrate 100. FIG. 3 illustrates the photoelectric conversion portions PD, the semiconductor regions 107, the gate electrodes 108, and the first wiring members 110. The cross sectional view corresponding to the cross section along the I-I line (X-axis direction) of FIG. 3 is FIG. 1. FIG. 3 illustrates two first pixels 101 and one second pixel 102 similarly as in FIG. 1, in which the same members as those in FIG. 1 are designated by the same reference numerals as those in FIG. 1 and the description thereof is omitted.

FIG. 3 illustrates each wiring line of the first wiring member 110 in detail. The wiring lines of the first wiring member 110 include a wiring line 110a, a wiring line 110b, a wiring line 110c, a wiring line 110d, a wiring line 110e, and a wiring line 110f from the left to the right of FIG. 3. For example, the wiring line 110a, the wiring line 110c, and the wiring line 110e are power supply lines for supplying a power supply to the elements. The wiring line 110b, the wiring line 110d, and the wiring line 110f are signal lines for outputting signals from pixels. The wiring line 110a, the wiring line 110c, and the wiring line 110e have a width W1 and the wiring line 110b, the wiring line 110d, and the wiring line 110f have a width W2. In FIG. 3, the width W1 and the width W2 have equal values. Herein, the light shielding portion 122 is integrated with the wiring line 110c, and it may also be said that the wiring line 110c extends to the center of the photoelectric conversion portion PD by only a width W3. The light shielding portion 123 is integrated with the wiring line 110d, and it may also be said that the wiring line 110d extends to the center of the photoelectric conversion portion PD by only a width W4. The opening 124 is formed by the light shielding portion 122 and the light shielding portion 123. The opening 124 has a width W5. Herein, the width W1 to the width W5 is a length in the X direction in FIG. 3. In FIG. 3, each contact 301 connects the gate electrode 108 and a wiring line (not illustrated). Each contact 302 connects the semiconductor region 107 and a wiring line (not illustrated). Under the light shielding portion 122 and the light shielding portion 123 of FIG. 3, the reflection preventing portion 126 and the reflection preventing portion 127 are provided, respectively.

In this embodiment, the light shielding portion 122 and the light shielding portion 123 are integrated with the wiring line 110c and wiring line 110d, respectively, and therefore contain a material containing aluminum as the main component. As materials of the reflection preventing portion 126 and the reflection preventing portion 127, titanium nitride, tantalum nitride, silicon nitride, and the like are applicable. In this embodiment, as materials of the reflection preventing portions, since the light shielding portion 122 and the light shielding portion 123 contain materials containing aluminum as the main component, it is suitable to use titanium nitride having good adhesion properties therewith. For the same reason, when the wiring members contain materials containing copper as the main component, tantalum nitride is suitable. When the wiring members contain materials containing tungsten as the main component, silicon nitride is suitable. The materials of the reflection preventing portion 126 and the reflection preventing portion 127 are not limited thereto. The reflection preventing portion 126 and the reflection preventing portion 127 may be provided with a fine pattern of a wavelength size of incident light.

Herein, the light shielding portion 122, the light shielding portion 123, and the opening 124 are described. The opening 124 has a slit shape but may have a closed loop shape. More specifically, in FIG. 3, a light shielding portion may be provided also in the Y-axis direction and the opening 124 may be surrounded by the light shielding portions. As illustrated in FIG. 3, the center of the opening 124 is disposed offset from the center of the photoelectric conversion portion PD for focus detection. The light shielding portions of this embodiment are integrated with the wiring lines, and therefore may be simultaneously formed by the same material. Since a manufacturing method thereof may be formed by general semiconductor processes, the description thereof is omitted. However, the light shielding portions may be isolated from the wiring lines and may be formed by materials different from that of the wiring lines. The light shielding portion may also be provided in the second or third wiring member.

The width W5 of the opening 124 may be, for example, 60% length to the width (length in the X direction in FIG. 3) of the photoelectric conversion portion PD and is suitably smaller than 50% in view of focus detection performance. The width W3 and the width W4 vary depending on the width of the photoelectric conversion portion PD and are determined in such a manner as to satisfy the width W5. In this embodiment, although the width W3 has a value smaller than that of the width W4, the opposite case may be acceptable.

In this embodiment, the insulating film 109 under the light shielding portion 122 and the light shielding portion 123 contains silicon oxide materials. The insulating film 109 suitably contains a material having low hardness among the silicon oxide materials, e.g., Boron Phosphor Silicate Glass (BPSG) to which boron and phosphorus are added. The hardness of silicon oxide decreases by adding boron or the like as compared with one which is formed by a high-density plasma CVD method and to which boron or the like is not added. When the hardness of materials is high, separation may arise between the light shielding portion 122 or the light shielding portion 123 and the insulating film 109 due to the stress of the light shielding portion 122 or the light shielding portion 123. However, the use of materials having low hardness may reduce the occurrence of the separation. The hardness of the BPSG may be adjusted by the addition amount of boron and phosphorus.

As described above, according to the configuration of this embodiment, the reflection in the light shielding portion extending above the photoelectric conversion portion may be reduced.

Second Embodiment

Unlike the solid-state image pickup device of the first embodiment, a solid-state image pickup device of this embodiment has adhesion portions, in addition to the reflection preventing portions, on the underface side of the light shielding portion 122 and the light shielding portion 123. Due to the presence of such adhesion portions, the occurrence of the separation between the light shielding portion 122 and the light shielding portion 123 and the insulating film 109 may be reduced. Moreover, unlike the solid-state image pickup device of the first embodiment, the solid-state image pickup device of this embodiment has another reflection preventing portions on the upper face side of the light shielding portion 122 and the light shielding portion 123. Such a configuration may achieve a reduction in reflection on the upper face of incident light. The reflection preventing portions on the upper face side may also have a function of reflection prevention in photolithography when forming the light shielding portions.

Figure 4:
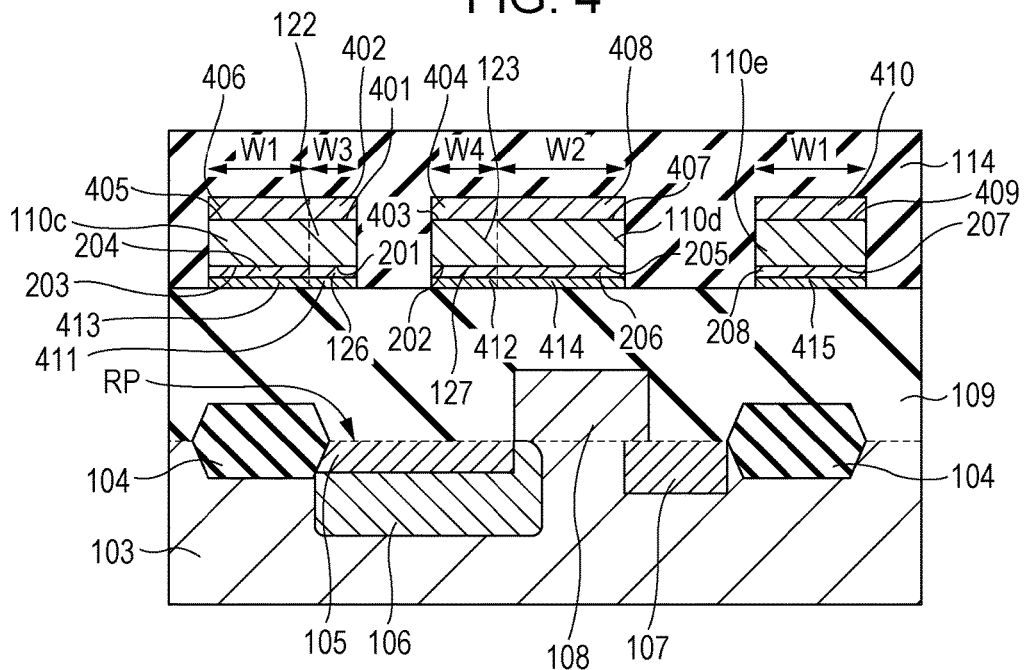
FIG. 4 is a schematic cross sectional view for explaining a solid-state image pickup device of a second embodiment.

FIG. 4 is a schematic cross sectional view of a solid-state image pickup device corresponding to FIG. 3A. In FIG. 4, an adhesion portion 411 is provided between the reflection preventing portion 126 on the underface 201 side of the light shielding portion 122 and the insulating film 109. An adhesion portion 412 is provided between the reflection preventing portion 127 on the underface 202 side of the light shielding portion 123 and the insulating film 109. In this embodiment, the adhesion portion 411 and the adhesion portion 412 are layers containing titanium. Due to the presence of the adhesion portion 411 and the adhesion portion 412, the adhesion properties between the insulating film 109 and the reflection preventing portion 126 and the reflection preventing portion 127 may be increased.

The adhesion properties are described. For example, with respect to titanium nitride directly provided on the insulating film 109 containing silicon oxide, the orientation properties vary depending on the film formation conditions or places, so that the adhesion properties with a metal layer and the optical characteristics vary. The distance between crystal planes of the crystal plane (002) of titanium and the crystal plane (111) of titanium nitride is 2.3410 Å. The crystal plane spacing in the crystal plane (111) of aluminum is 2.3380 Å. Thus, by the use of materials having a crystal plane spacing almost equal to that of the light shielding portions and the reflection preventing portions as the adhesion portions, it becomes possible to maintain the orientation properties, so that a structure having high adhesion properties is obtained.

Herein, titanium is mentioned as an example as the adhesion portions but other materials may be acceptable. The materials may be selected in such a manner that the crystal plane spacing of the light shielding portion and the crystal plane spacing of the reflection preventing portion have equal values or have close values. The adhesion portion may be constituted by a plurality of layers.

The thickness of the adhesion portion 411 and the adhesion portion 412 is described. Supposing that the thickness of the adhesion portion 411 and the thickness of the adhesion portion 412 are equal to each other, the thickness is provisionally defined as T1. The thickness T1 of the adhesion portion 411 and the adhesion portion 412 containing titanium is suitably 8 nm or more 15 nm or lower.

Hereinafter, the adhesion properties are described. Table 1 shows the relationship between the stability and the reflectance of a titanium film when the titanium film is formed on a film containing silicon oxide by a sputtering method, and then the film thickness is changed. The film thickness refers to a length of the film along the vertical direction from the principal face of the semiconductor substrate 100. When the film thickness of the titanium film becomes excessively thick, the reflection on the titanium film becomes high, so that the function of the reflection preventing portions may not be exhibited. When the film thickness is excessively thin, the stability of the titanium film decreases, so that the stability of the film of the reflection preventing portions containing titanium nitride decreases, and thus the separation or the like is likely to occur. Therefore, the thickness T1 of the adhesion portions containing titanium is suitably 8 nm or more and 15 nm or lower in view of separation.

TABLE 1

| | Film thickness of titanium film (nm) | | | |
| --- | --- | --- | --- | --- |
| | 5 | 8 | 15 | 20 |
| Stability of titanium film | X | ○ | ○ | ○ |
| Reflectance of titanium film | ○ | ○ | ○ | X |

The adhesion portion may be applied to the wiring lines likes similarly as the reflection preventing portion. More specifically, in FIG. 4, an adhesion portion 413 is provided between the reflection preventing portion 204 on the underface 203 side of the wiring line 110c and the insulating film 109 and an adhesion portion 414 is provided between the reflection preventing portion 206 on the underface 205 side of the wiring line 110d and the insulating film 109. Such a configuration may further reduce light which enters an unintended portion. Moreover, an adhesion portion 415 may be provided also between the reflection preventing portion 208 on the underface 207 side of the other wiring line 110e and the insulating film 109.

In FIG. 4, another reflection preventing portion 402 is provided on the side of an upper face 401 of the light shielding portion 122. Moreover, another reflection preventing portion 404 is provided on the side of an upper face 403 of the light shielding portion 123. In this embodiment, each of the reflection preventing portion 402 and the reflection preventing portion 404 is constituted by one layer containing titanium nitride, but they may be constituted by a plurality of layers, respectively. Due to the presence of the reflection preventing portion 402 and the reflection preventing portion 404, it becomes possible to reduce reflection on the upper face of incident light. The reflection preventing portions on the upper face side may also have a function of reflection prevention in photolithography when forming the light shielding portion.

The reflection preventing portion may be applied to wiring lines similarly as the reflection preventing portion or the adhesion portion. More specifically, in FIG. 4, a reflection preventing portion 406 may be provided on the side of an upper face 405 of the wiring line 110c and a reflection preventing portion 408 may be provided on the side of an upper face 407 of the wiring line 110d. Such a configuration may further reduce light which enters an unintended portion. A reflection preventing portion 410 may be provided also on the side of an upper face 409 of the other wiring line 110e.

Third Embodiment

A solid-state image pickup device of this embodiment has a protective portion in addition to the configuration of the solid-state image pickup device of the second embodiment. A protective portion 501 is provided between the upper face 401 of the light shielding portion 122 and the reflection preventing portion 402. Moreover, a protective portion 502 is provided between the upper face 403 of the light shielding portion 123 and the reflection preventing portion 404. Due to the presence of such a protective portion, it becomes possible to suppress a reaction of materials of the light shielding portion 122 and the light shielding portion 123 and the reflection preventing portion 402 and the reflection preventing portion 404, respectively. For example, when the light shielding portion 122 and the light shielding portion 123 contain aluminum and the reflection preventing portion 402 and the reflection preventing portion 404 contain titanium nitride, the protective portion 501 and the protective portion 502 contain titanium. In the case where the protective portion 501 and the protective portion 502 are not provided, aluminum deteriorates when forming titanium nitride, so that the resistance increases in some cases. As described in the first and second embodiment, when the light shielding portions are formed in a common process with the wiring lines, the resistance of the wiring lines may become high.

In this embodiment, it is suitable that the thickness of the reflection preventing portions is larger than that of the adhesion portions and the protective portions containing titanium. This is suitable for reflection reduction. By increasing the thickness of the adhesion portions containing titanium similarly as the protective portions than that of the protective portions, it becomes possible to further reduce film separation due to the stress of the light shielding portions. It is also suitable that the thickness of the reflection preventing portions containing titanium nitride on the upper face side of the light shielding portions is larger than that of the reflection preventing portions containing titanium nitride on the underface side of the light shielding portions. For example, this is because the reflection preventing portions may also function as an etching stop film when providing a via plug and the like in a portion serving as the light shielding portion. Moreover, the stress may be reduced while preventing the reflection of entering light by the reflection preventing portion on the upper face side and suppressing reflection by the reflection preventing portion on the lower face side. As specific values, the thickness of the adhesion portion containing titanium is 5 nm or more and 20 nm or lower and the thickness of the reflection preventing portion containing titanium nitride on the lower face side of the light shielding portion is 10 nm or more and 50 nm or lower. The thickness of the light shielding portion containing aluminum is 100 nm or more and 500 nm or lower, the thickness of the protective portion containing titanium on the upper side of the light shielding portion is 1 nm or more and 20 nm or lower, and the thickness of the reflection preventing portion containing titanium nitride on the upper side of the light shielding portion is 35 nm or more and 75 nm or lower. It is suitable to satisfy the size relationship of the above-described film thicknesses in such a range.

Figure 5:
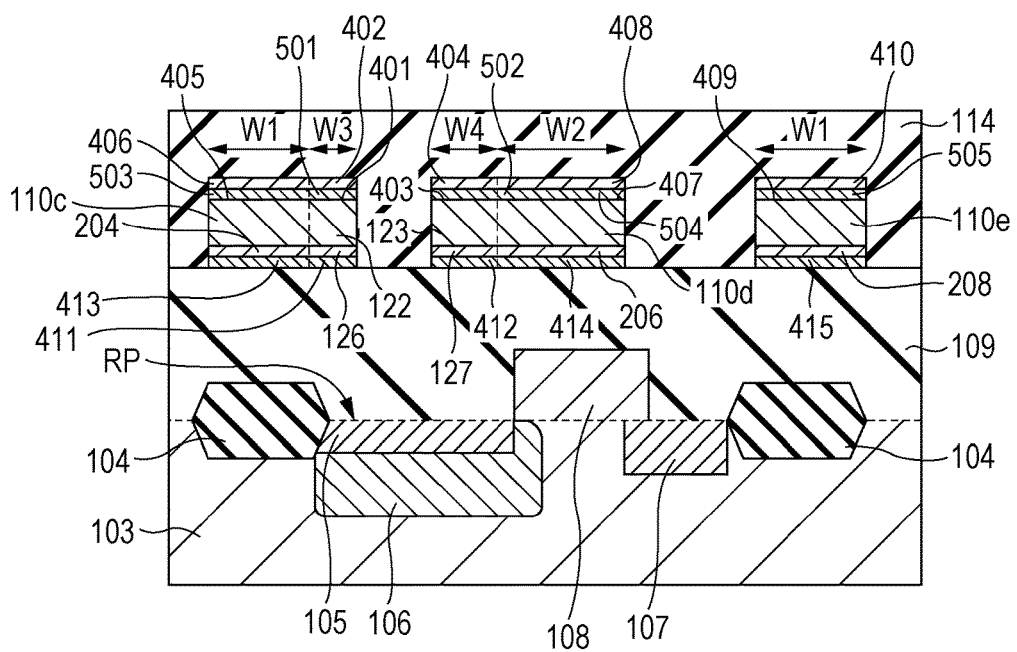
FIG. 5 is a schematic cross sectional view for explaining a solid-state image pickup device of a third embodiment.

The protective portion may be applied to the wiring lines similarly as the reflection preventing portion or the adhesion portion. More specifically, in FIG. 5, a protective portion 503 may be provided between an upper face 405 of the wiring line 110c and the reflection preventing portion 406 and a protective portion 504 may be provided between an upper face 407 of the wiring line 110d and the reflection preventing portion 408. A protective portion 505 may also be provided between an upper face 409 of the other wiring line 110e and the reflection preventing portion 410.

Hereinafter, as an application example of the solid-state image pickup device described above, an image pickup system in which the solid-state image pickup device is installed is described. The concept of the image pickup system includes not only a device which performs image pickup as the main purpose (e.g., a camera and a camcorder) but a device having an image pickup function as an auxiliary function (e.g., a personal computer and a mobile terminal). The image pickup system includes the solid-state image pickup device described as the embodiments and a processing portion which processes signals output from the solid-state image pickup device. The processing portion may include an analog-to-digital (A/D) converter and a processor which processes digital data output from the A/D converter, for example.

According to the solid-state image pickup device described in the first to third embodiments, the reflection in the light shielding portion extending above the photoelectric conversion portion may be reduced.

The disclosure is not limited to the above-described embodiments and may be altered as appropriate. Each embodiment may be combined. The disclosure may be applied to the configuration having a light shielding portion extending above a photoelectric conversion portion without being limited to a focus detection pixel.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A solid-state image pickup device, comprising:
an image pickup pixel having a first photoelectric conversion portion and a first transistor for reading out a signal based on a charge generated in the photoelectric conversion portion;
a focus detection pixel having a second photoelectric conversion portion, a second transistor for reading out a signal based on a charge generated in the second photoelectric conversion portion, and a light shielding portion formed in a first wiring layer and having an opening, the second photoelectric conversion portion having a light receiving face that receives light through the opening;
a first film containing titanium and being provided on an under face side of the light shielding portion and not extending through the opening;
a second film containing titanium nitride and being provided on an upper face side of the light shielding portion and not extending through the opening and below a first insulating film, the upper face side being positioned farther apart from the light receiving face than from the under face side;
a third film containing titanium and being provided between the first film and the second photoelectric conversion portion; and
a wiring line for the first transistor and the second transistor provided above the first transistor and the second transistor,
wherein a thickness of the second film is larger than that of the first film in height direction,
wherein the wiring line and a structure having the light shielding portion, the first film, the second film, and the third film are provided in the same layer, and
wherein the second film is formed between the light shielding portion and a second wiring layer above the first wiring layer.

2. The solid-state image pickup device according to claim 1, wherein the first film contains nitride.

3. The solid-state image pickup device according to claim 1 further comprising:
a fourth film containing titanium is provided between the light shielding portion and the second film,
wherein the thickness of the first film and the second film are larger than that of the fourth film in height direction.

4. The solid-state image pickup device according to claim 1, wherein the light shielding portion contains aluminum.

5. The solid-state image pickup device according to claim 4, wherein the light shielding portion is provided on a second insulating film covering the second photoelectric conversion portion,
an adhesion film containing titanium is provided between the second insulating film and the first film, and
the thickness of the first film and the second film are larger than that of the adhesion film.

6. The solid-state image pickup device according to claim 5, wherein a thickness of the adhesion film containing titanium is 8 nm or more and 15 nm or lower.

7. The solid-state image pickup device according to claim 5, wherein the second insulating film contains BPSG.

8. The solid-state image pickup device according to claim 5, wherein
the light shielding portion is provided on the second insulating film covering the second photoelectric conversion film, and
the second insulating film contains BPSG.

9. The solid-state image pickup device according to claim 1, wherein a protective portion containing titanium is provided between the light shielding portion and the second film.

10. The solid-state image pickup device according to claim 1, wherein the second film is provided on an upper face side of the wiring line.

11. The solid-state image pickup device according to claim 1, wherein
the light shielding portion has an opening corresponding to a part of the second photoelectric conversion portion, and
a center of the opening is offset from a center of the second photoelectric conversion portion.

12. The solid-state image pickup device according to claim 1, wherein the wiring line is formed by the same material as the structure.

13. The solid-state image pickup device according to claim 1 further comprising:
a microlens corresponding to the second photoelectric conversion portion, wherein the light shielding portion is provided between the microlens and the second photoelectric conversion portion.

14. The solid-state image pickup device according to claim 1 further comprising:
a floating diffusion region is adjacent to the second photoelectric conversion portion in a first direction in planar view, wherein the opening extends in a second direction different from the first direction in planar view.

15. The solid-state image pickup device according to claim 1, wherein the third film contains titanium.

16. The solid-state image pickup device according to claim 1, wherein the third film has a higher content rate of titanium than the first film.

17. The solid-state image pickup device according to claim 1, wherein the first film is thicker than the third film.

18. An image pickup system, comprising:
the solid-state image pickup device according to claim 1; and
a processing portion which processes a signal from the solid-state image pickup device.

* * * * *